United States Patent [19]

Poivet et al.

[11] Patent Number: 5,249,229
[45] Date of Patent: Sep. 28, 1993

[54] DEVICE AND METHOD FOR GENERATING CONTROL SIGNALS

[75] Inventors: Michel Poivet, Illkirch; Jean-Claude Guillon, Gerstheim; Patrick Daniel, Strasbourg, all of France

[73] Assignee: Laboratoire Europeen De Recherches Electroniques Avancees Societe En Nom Collectif, Courbevoie, France

[21] Appl. No.: 896,917
[22] PCT Filed: Mar. 23, 1990
[86] PCT No.: PCT/FR90/00196
§ 371 Date: Dec. 4, 1990
§ 102(e) Date: Dec. 4, 1990
[87] PCT Pub. No.: WO90/12471
PCT Pub. Date: Oct. 18, 1990

Related U.S. Application Data

[63] Continuation of Ser. No. 613,647, Dec. 4, 1990, abandoned.

[30] Foreign Application Priority Data

Apr. 4, 1989 [FR] France ............... 89 04404

[51] Int. Cl.⁵ ........................................... H04N 7/167
[52] U.S. Cl. ............................................ 380/14; 380/5; 380/11; 358/320; 358/339
[58] Field of Search ............... 380/5, 11, 14, 17, 15, 380/20, 49, 50; 358/320, 321, 338, 339, 340

[56] References Cited

U.S. PATENT DOCUMENTS

| | | | |
|---|---|---|---|
| 4,547,802 | 10/1985 | Fogarty et al. | 380/15 X |
| 4,604,658 | 8/1986 | Hibino et al. | 358/339 X |
| 4,673,975 | 6/1987 | Inaba . | |
| 4,710,966 | 12/1987 | Aufiero . | |
| 4,733,312 | 3/1988 | Morimoto | 358/339 X |
| 4,910,772 | 3/1990 | Matias et al. | 380/20 |
| 4,959,825 | 9/1990 | Okano | 358/339 X |
| 4,977,462 | 12/1990 | Takanashi et al. | 358/339 |
| 4,987,491 | 1/1991 | Kaite et al. | 358/340 X |
| 5,034,981 | 7/1991 | Leonard et al. | 380/5 |

FOREIGN PATENT DOCUMENTS

| | | |
|---|---|---|
| 0124942 | 11/1984 | European Pat. Off. . |
| 0160398 | 11/1985 | European Pat. Off. . |
| 0119945 | 12/1987 | European Pat. Off. . |
| 2543391 | 9/1984 | France . |
| 88/02955 | 4/1988 | World Int. Prop. O. . |

OTHER PUBLICATIONS

*Electronics Letters*, vol. 22, No. 2, 16 Jan. 1986, P. Axon: "Scheme for achieving continuously variable delay in digital test equipment", pp. 102-103.

*Electron Design*, vol. 36, No. 11, 12 May 1988, C. Jay et al.: "Use logic cell array to control a large FIFO buffer", pp. 113-116.

*Electronics International*, vol. 55, No. 13, 12 30 Jun. 1982, D. Vakili: "RAM makes programmable digital delay circuit", p. 121.

*Primary Examiner*—Tod R. Swann
*Attorney, Agent, or Firm*—Oblon, Spivak, McClelland, Maier & Neustadt

[57] ABSTRACT

A device and to a method for generating control signals is set forth. The device according to the present invention allows the generation, from a single time reference, of the write control ($\overline{WE}$) and read control ($\overline{RE}$) signals for the information relating to a video line in a storage device (7, 8, 17, 18, 20). In this way, possible shifts between the synchronization of two successive lines due in particular to the transmission are overcome. The device according to the present invention is applied in particular to the generation, from a common time reference, of write signals and of read signals for a storage device (7, 8, 17, 18, 20) intended for storing a video image line.

The invention applies principally to the production of devices for unscrambling scrambled television transmissions, particularly pay television transmissions.

7 Claims, 6 Drawing Sheets

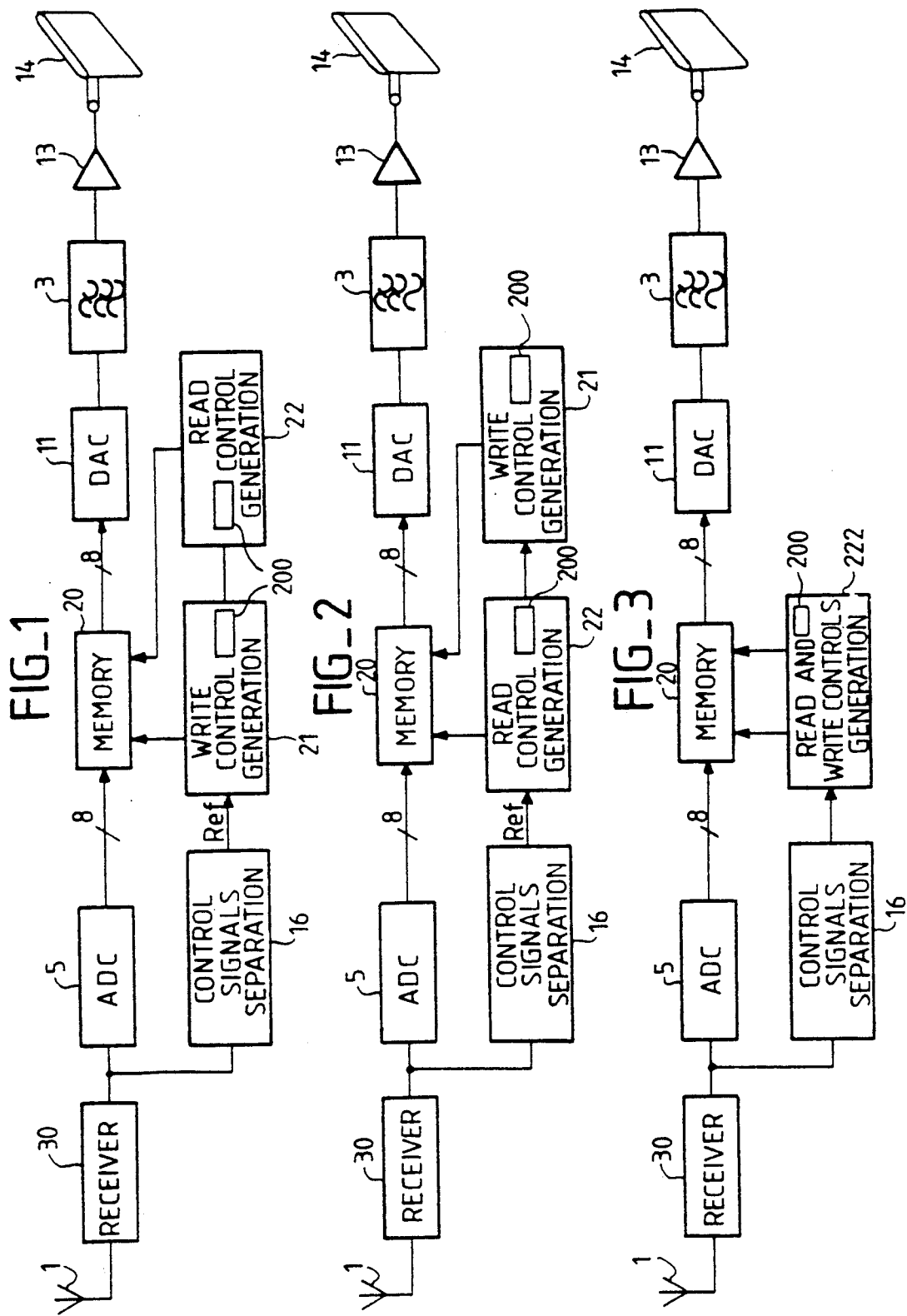

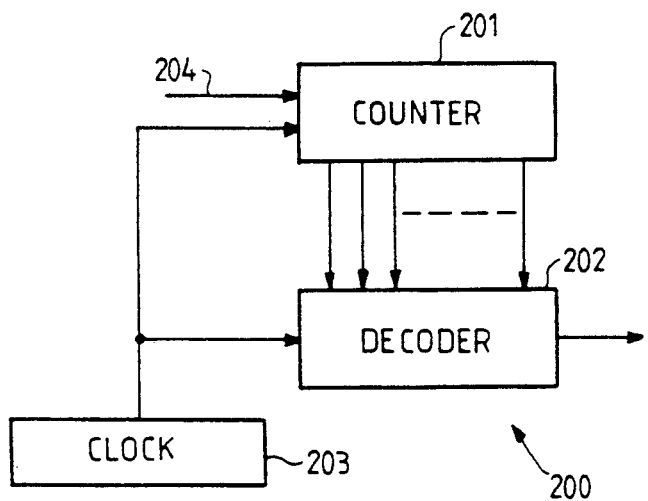
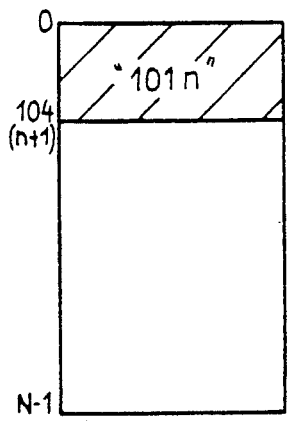
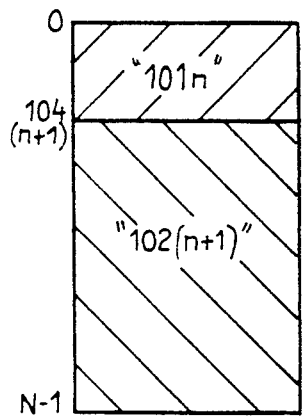
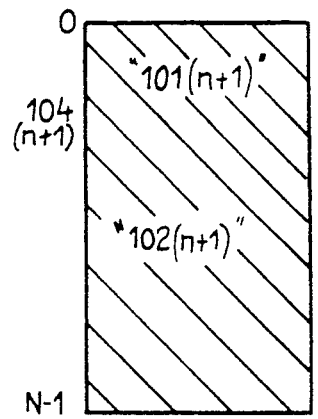
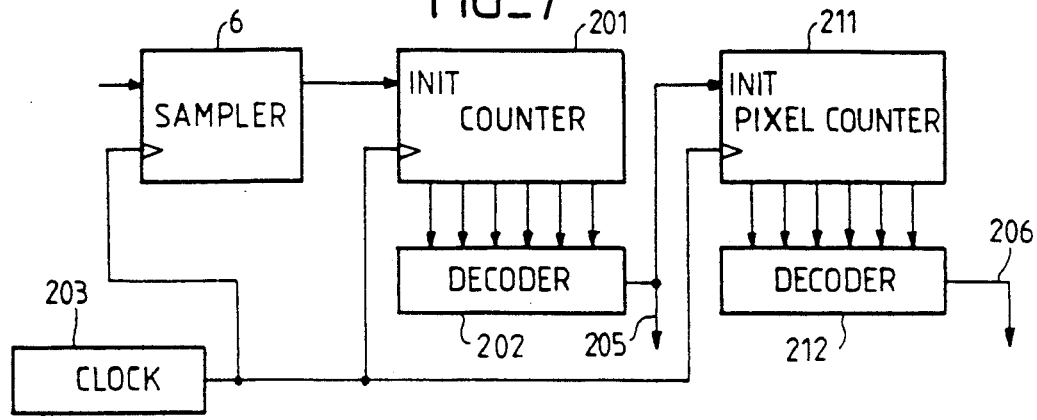

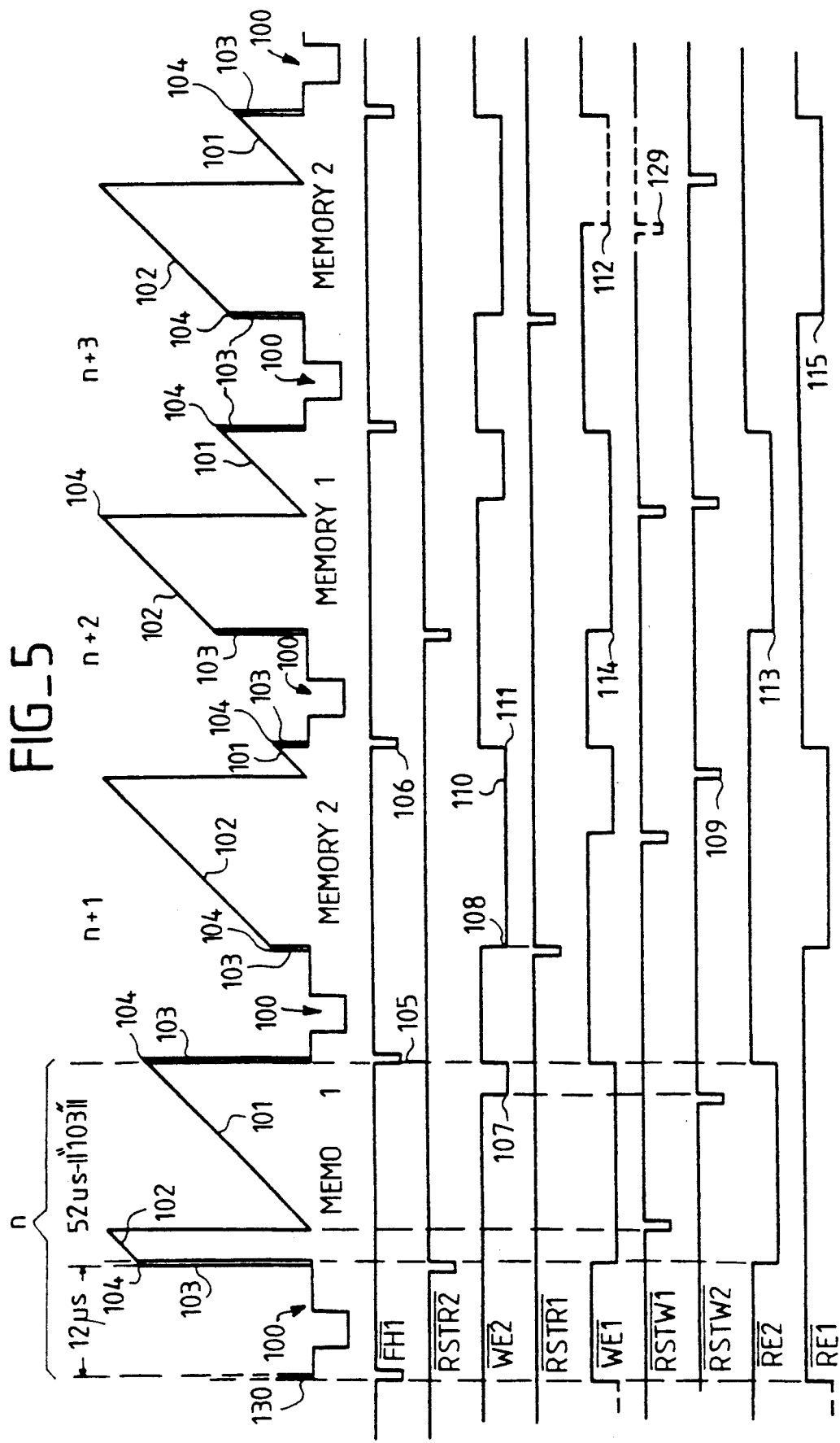
FIG_5

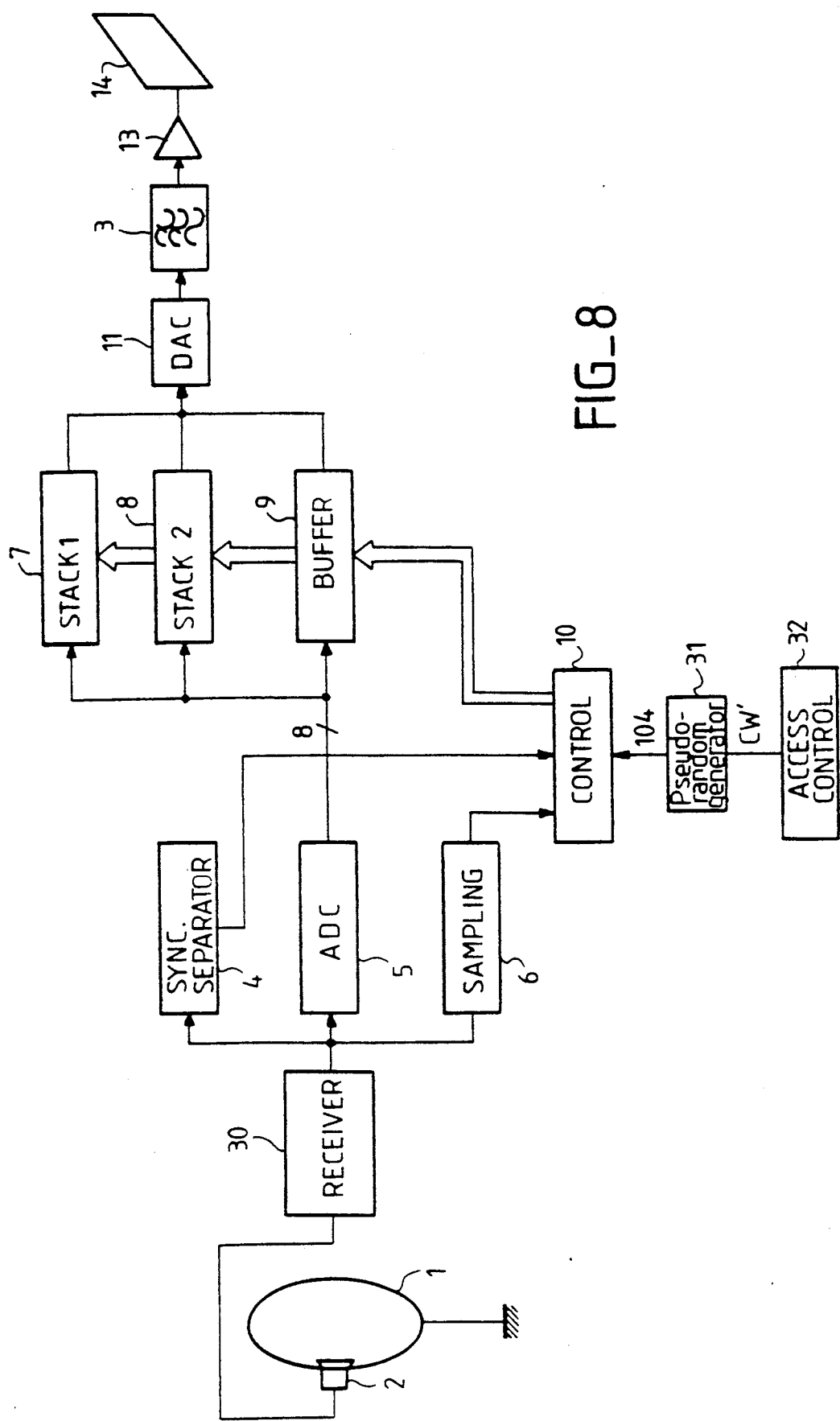
FIG_8

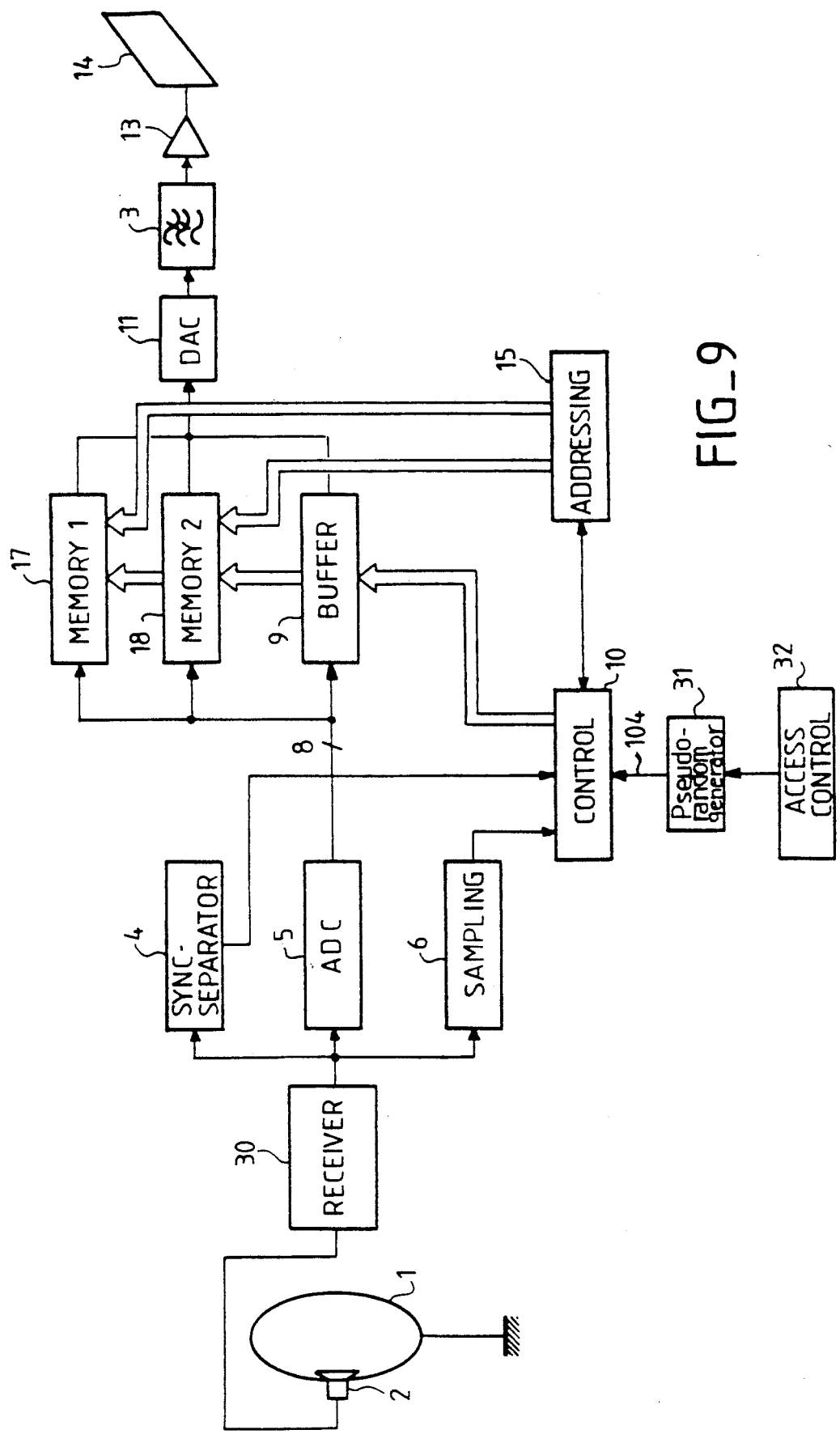

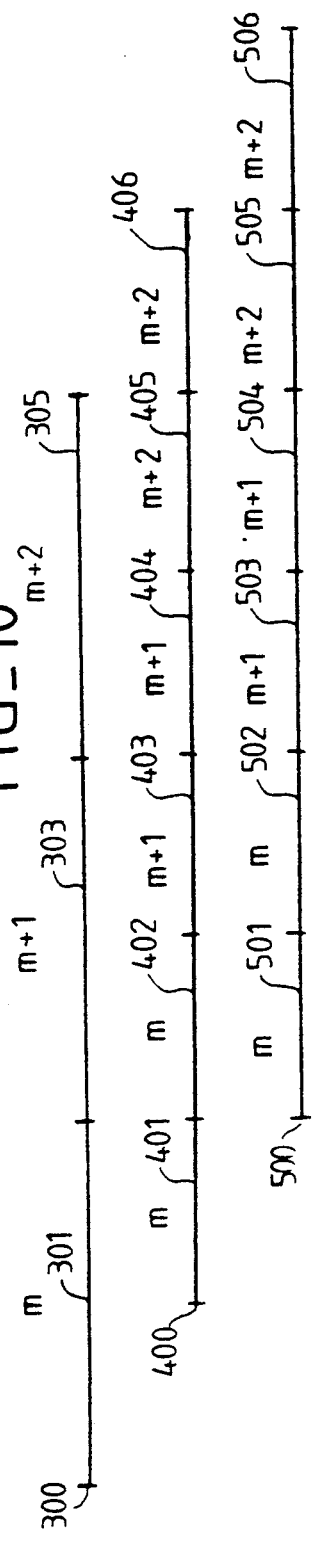
FIG_10
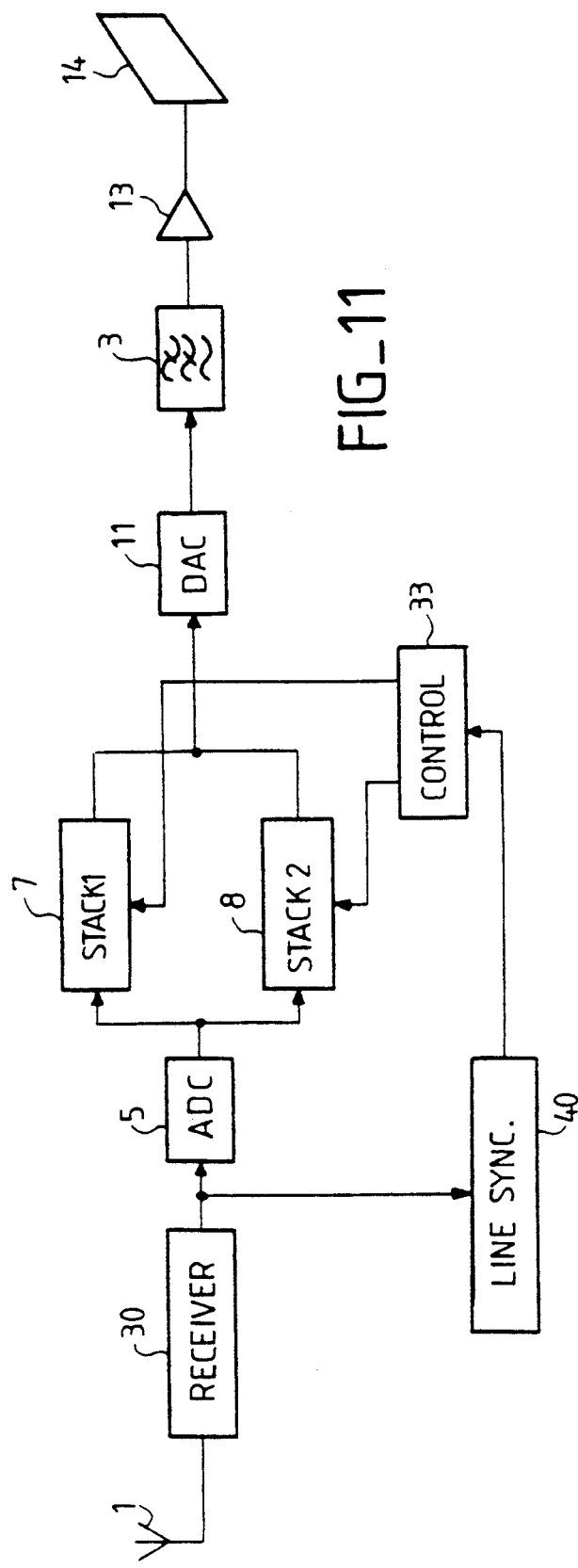
FIG_11

DEVICE AND METHOD FOR GENERATING CONTROL SIGNALS

This application is a continuation of application Ser. No. 07/613,647, filed on Dec. 4, 1990, now abandoned.

BACKGROUND AND SUMMARY OF THE INVENTION

The invention principally relates to a device and to a method for generating control signals and more particularly the read or write enable signals of line memories in a television device.

It is known to produce television receivers comprising memories capable of storing all or part of the image to be displayed. There are known in particular television devices comprising a line memory capable of storing an image line to be projected. Such devices have the disadvantage of generating a delay of one line between the reception and the display. This delay can have serious consequences in the case in which it is necessary to generate read or write enable signals for such a memory (WRITE ENABLE, READ ENABLE or, in abbreviated form, $\overline{WE}$ and $\overline{RE}$ respectively in English terminology). The over-bar signifies that the signals are active in the low state. It is of course understood that the use of active signals in the high state does not depart from the scope of the present invention. In fact, in conventional type devices different synchronization signals are used for carrying out the writing and the reading of an image line. Thus, the reading of a line can be affected by the synchronization shift called jitter occurring between two successive lines of the image. Thus, for example, a vertical white line re-read from a device of known type comprises points horizontally shifted to the left or to the right depending on the synchronization shift present.

The device according to the present invention generates read and write signals of a line memory, for the same information, from a single time reference, in order to avoid the appearance of the said jitter affecting the lines of the video image.

In a first embodiment, the write and read signals are directly generated from a same time reference In a second embodiment, the write enable signal $\overline{WE}$ is generated from a time reference. The read enable signal $\overline{RE}$ is generated from the write enable signal $\overline{WE}$.

The device according to the present invention is particularly useful in the device comprising two line memories connected in parallel, each being alternately in the read mode and in the write mode while the other is in the read mode and then in the write mode. An example of this type of device is constituted by the television image unscrambling device.

The invention relates principally to a device for the generation of write control signals ($\overline{WE}$) and of read control signals ($\overline{RE}$) in a memory of a video signal element, characterized in that it comprises means of generating the said control signals ($\overline{RE}$, $\overline{WE}$) directly or indirectly from a same time reference The invention also relates to a device characterized in that the element of the video signal is a display line.

The invention also relates to a device characterized in that it comprises, connected in series, means of the write control signal ($\overline{WE}$) and the means of generating the read control signal ($\overline{RE}$) in such a way that the read control signal ($\overline{RE}$) is generated from the write control signal ($\overline{WE}$).

The invention also relates to a device characterized in that the said device is a digital device.

The invention also relates to device characterized in that the means of generation of the time reference, the means of generation of the write control signals ($\overline{WE}$) and/or the means of generation of the read control signals ($\overline{RE}$) comprise a counter whose output is connected a decoder.

The subject of the invention is also an unscrambling device characterized in that it comprises two stacks of the first in, first out (FIFO) type working alternately in the write mode and in the read mode.

The subject of the invention is also an unscrambling device characterized in that it comprises two dynamic random access memories working alternately in the write mode and in the read mode connected by an address bus to an addressing device.

The subject of the invention is also a television set characterized that it comprises an unscrambling device.

The subject of the invention is also a method for generating write control signals ($\overline{WE}$) and read control signals ($\overline{RE}$) of a video line in a storage device characterized in that it comprises the steps:

generation of a time reference for a line i, generation directly or indirectly from the time reference of the line i of the write control signal of the line i ($\overline{WE}$) and of the read control signal of the line i ($\overline{RE}$).

The subject of the invention is also a method characterized in that it comprises the steps:

generation of the write control signal of the line i ($\overline{WE}$) from the time reference of the line i, generation of the read control signal of the line i ($\overline{RE}$) from the write control signal of the line i ($\overline{WE}$).

The subject of the invention is also a method characterized in that it comprises the steps of generation of write control (WE) and read control (RE) signals of the line i directly.

BRIEF DESCRIPTION OF THE DRAWINGS

The invention will be better understood by means of the following description and of the appended figures given as non-limitative examples and in which:

FIG. 1 is a block diagram of the production of a first embodiment of the device according to the present invention;

FIG. 2 is a block diagram of the production of a second embodiment of the device according to the present invention;

FIG. 3 is a block diagram of the production of a third embodiment of the device according to the present invention;

FIG. 4 is a block diagram of the production of a delay device capable of being used in the device according to the present invention;

FIG. 5 is a block diagram showing an example of the functioning of the device according to the present invention;

FIGS. 6a-c is a block diagram showing an example of the functioning of the device according to the present invention;

FIG. 7 is a block diagram of an embodiment of a device for generating signals capable of being used in the device according to the present invention;

FIG. 8 is a block diagram of a fourth embodiment of the device according to the present invention;

FIG. 9 is a block diagram of a fifth embodiment of the device according to the present invention;

FIG. 10 is a diagram explaining the functioning of an embodiment of the device according to the present invention;

FIG. 11 is a block diagram of an embodiment of the device according to the present invention corresponding to the functioning shown in FIG. 10.

DETAILED DESCRIPTION OF THE INVENTION

In FIGS. 1 to 10 the same references have been used to denote the same elements.

In FIG. 1 there can be seen a first embodiment of a television receiver according to the present invention.

The device of FIG. 1 comprises a source 1 of television signals, for example an antenna. The antenna 1 is connected to the input of a television receiver (tuner in English terminology) 30 of a known type. The output of the television receiver 30 is connected on the one hand to the input of an analog-digital converter 5 and on the other hand to the input of a control signals separation device 16. The output of the analog-digital converter 5 is connected, for example by an 8-bit bus, to the input of a storage device 20. The storage device 20 is for example a video memory, a dynamic memory or a register of the "first in, first out" type (FIFO in English terminology). Advantageously, the storage device 20 is of the line memory type. i.e. capable of storing one scanning line of a television image. The output of the control signals separation device 16 is connected to the input of a device 21 for the generation of write control signals. The output of the device for the generation of write control signals 21 is connected on the one hand to the control input of the storage device 20, and on the other hand to the input of a device for the generation of read control signals 22. The output of the device for the generation of read control signals 22 is connected to a control signals input of the storage device 20. The output of the storage device 20 is connected to a device for exploiting images. In the example shown in FIG. 1, the exploitation device comprises an analog-digital converter 11, a low pass filter 3, an amplifier 13 and a cathode ray tube 14. It is of course understood that the use of other devices for the exploitation of the image does not depart from the scope of the present invention.

The receiver 30 supplies to the analog-digital converter 5 the active signals intended for the scanning of the cathode ray tube 14, and to the control signals separation device 16 the synchronization and line return signals. The analog-digital converter 5 performs the digitization of the television signals intended to be displayed. The signals digitized by the analog-digital converter are stored in the storage device 20. The control signals separation device 16 is firstly a time reference based on the synchronization signals supplied by the receiver 30. The write control signals generating device 21 is firstly a control of writing in the memory 20. In the presence of this control the signals supplied by the analog-digital converter 5 are stored in the storage device 20. The write 20 and read 22 control generation devices comprise for example a device 200 intended to generate the delay. Advantageously the device 200 is a digital delay generating device. From the write control signals, the read control signals generation device 22 generates read control signals of the storage device 20. The read control signals of the storage device 20 allow the reading of the section of the image stored in the storage device 20.

It is of course understood that the write control signals and the read control signals may apply only to one section of the storage device 20.

In FIG. 1 there has been shown a digital variant embodiment of the device according to the present invention. It is of course understood that an analog variant embodiment of the storages and/or of the read and write control signals generation does not depart from the scope of the present invention.

In the example shown in FIG. 1, the read control signal is generated from the write control signal of the storage device 20. Thus, the variations of synchronization between the writing and the reading of the storage device 20 do not risk causing shifting of the image stored in the storage device 20.

In FIG. 2 there can be seen a variant embodiment of the device according to the present invention in which the write control signal is generated from the read control signal. In such a case the output of the control signals separation device 16 is connected to the input of the read control signals generation device 22. The output of the read control signals generation device 22 is connected on the one hand to a control signal input of the storage device 20 and on the other hand to the input of the write control signals generation device 21. The output of the write control signals generation device 21 is connected to a control signal input of the storage device 20.

In FIG. 3 there can be seen a device according to the present invention comprising a read and write control signals generation device 222. In the case shown in FIG. 3, the read and write control signals are generated by a single device 222 from a time reference supplied by the control signals separation device 16. The information displayed from the storage device 20 is insensitive to jitter insofar as the read control signal and the write control signal, for the same information, has been generated from the same time reference.

In FIG. 4 there can be seen an embodiment of a delay device 200 of the control signals generation devices 21, 22, 222 of FIGS. 1, 2 and 3. The device 200 comprises for example a counter 201 connected to a de coder 202. The counter 201 and the decoder 202 receive signals from a clock 203. The reference signal from which the control signal 204 is generated performs the zero resetting of the counter 201. At each cycle of the clock 203 the counter 201 is incremented, for example by one unit. The decoder 202 is provided for generating a signal when the counter 201 has reached a predetermined value. This value corresponds to the desired number of clock cycles of delay of the signal by the decoder 202 with respect to the signal 204. Thus, in the example shown in FIG. 1, the write control signal generation device is initialized by the time reference generated by the control signals separation device 16. At the end of a predetermined number of clock cycles 203 the write control signal generation device 21 generates a write control signal simultaneously supplied to the storage device 20 or to the read control signal generation device 22. This signal initializes the counter of the read control signal generation device 22. At the end of a predetermined number of clock cycles the read control signal generation device 22 generates a read control signal supplied to the storage device 20. Advantageously, a same clock 203 is used for the device 200, the write control signal generation device 21 and the read control signal generation device 22.

The timing diagram of FIG. 5 shows the control signals of an scrambling device according to the present invention comprising two line memories alternately in the write mode or in the read mode (FLIP-FLOP in English terminology).

In FIG. 5 there can be seen an example of a timing diagram of the signals present in the television image unscrambling device. In the example shown in FIG. 5, the scrambling consists in a temporal inversion about a variable cut-off point 104 of the active part of each line. This type of scrambling is known per se. In FIG. 5, the video signal 130 corresponds to four successive lines n, n+1, n+2 and n+3. For purposes of clarity in the figure a signal has been used which, before scrambling, corresponded to a sawtooth. In this example it is extremely easy to identify, on a timing diagram, the various sections of the scrambled signal. It is of course understood that in reality the active signal will correspond to information to be transmitted.

Each line is composed of line return control signals 100, the segment 102 of the image included between the cut-off point 104 and the end of the line, followed by the segment 101 corresponding to the start of the line up to the point 104. The device according to the present invention is applied in particular to the unscrambling of images. The present invention is applied in particular to a scrambling method using overlay zones 103 about the cut-off point 104 and to a scrambling method applying the inversion only to a section of the signal in order to make the detection of the cut-off point 104 more difficult. An example of such a scrambling method is described in the French Patent No 88 17093 which is not yet published. The device according to the present invention generates a clock signal $\overline{FH1}$, active in the low state, comprising a pulse such as for example, 105 or 106 at each line return 100.

The signal $\overline{RSTR2}$ corresponds to the initialization of the read address of the second line memory which comprises brief pulses for the even lines. The lines numbered n+$\overline{2K}$ are called the even lines.

The signal $\overline{WE2}$, active in the low state, corresponds to the write enable of the second memory for one line in two. The signal $\overline{WE2}$ comprises a first active period like for example that starting at the point 107, corresponding to the preparation of the second memory and a second active period between the points 108 and 111 corresponding to the writing of useful information in the second memory. From the point 107 the writing of the end of the segment 101 of the line n is started in the second memory. As the line n corresponds to the information which normally must be stored in the first memory, the information stored in the second memory at this moment serves only for the preparation of the writing of the line n+1. The writing of the second memory stops at the moment of the line return 100 of the line n+1. The writing in the second memory starts again at the point 08 corresponding to the cut-off point 104. For example the unscrambling is performed during the writing of the first and second memories. In such a case, between the points 108 and 110, it is essential to write at the addresses corresponding to the segment 102. Starting from the point 110, corresponding to the end of the segment 102 and up to the point 111 corresponding to the point 104 the writing in the second memory is carried out starting from the address 0 up to that corresponding to the point 104 of the line n+1. The writing starts again in the same way for writing the line n+3 in the second memory.

The signal $\overline{RSTR1}$, active in the low state, comprises short pulses at the start of the active period every other line, for the lines n+1 and n+3 in FIG. 5. The signal $\overline{RSTR1}$ performs the initialization of the read address of the first memory.

The write enable signal in the memory 1 $\overline{WE1}$, active in the low state, functions for the even lines such as n or n+2 in a manner similar to $\overline{WE2}$ for the odd lines.

The signal $\overline{WE1}$ is shown in dotted line about the point 112 as this pulse corresponds to a line n+4 not shown in FIG. 5.

The signal $\overline{RSTW1}$, active in the low state, is the initialization signal of the write address of the first memory. It comprises brief pulses at each start of segment 101. About the point 129 the signal $\overline{RSTW1}$ is shown in dotted line as it corresponds to the line n+4 which is not shown in FIG. 5.

The signal $\overline{RSTW2}$ is a write address initialization signal of the second memory, active in the low state; it comprises for each even line a brief pulse corresponding to the start of the period of preparation for writing in the second memory (signal $\overline{WE2}$) and like for example at the point 109, at the start of the segments 101 of the odd lines.

The read enable signal of the second memory $\overline{RE2}$, active in the low state, comprises pulses included in the active section of the even lines.

The read enable signal of the first memory $\overline{RE1}$, active in the low state, comprises pulses during the active sections of the odd lines.

In order to ensure good synchronization of the reading and the writing, the device according the present invention uses a same reference signal, for example an $\overline{FH1}$ for generating the write enable signals $\overline{WE}$ and read enable signals $\overline{RE}$ for each line. For example the pulse $\overline{FH1}$ beginning at the point 105 allows the generation of the pulse $\overline{WE2}$ beginning at the point 108 and $\overline{RE2}$ beginning at the point 113.

The pulse $\overline{WE2}$ beginning at the point 108 is generated from the pulse $\overline{FH1}$ beginning at the point 105.

In a first embodiment of the device according to the present invention the pulse $\overline{RE2}$ beginning at the point 113 is generated from the pulse $\overline{WE2}$ beginning at the point 105.

In a second embodiment of the device according to the present invention the pulse $\overline{RE2}$ beginning at the point 113 is generated from the $\overline{WE2}$ beginning at the point 108.

In both cases, the write enable $\overline{WE2}$ and the read enable $\overline{RE2}$ the second memory are synchronized with each other and are not therefore affected by a shift in the synchronization of the two successive lines which is always possible. Similarly, for the first memory, the pulse $\overline{FH1}$ beginning at the point 106 is used for the generation of the write enable pulses of the first memory $\overline{WE1}$ beginning at the point 114 and for generating the read enable pulse of the first memory $\overline{RE1}$ beginning at the point 115.

The device according to the present invention allows the overcoming, during the unscrambling of television images, of jitter resulting for example from transmission conditions substantially affecting the periodicity of the regenerated line synchronization($64\mu s \pm \epsilon$).

In FIG. 6 there can be seen a diagram explaining the writing in a storage device of video image lines like for example the line n+1. The memory comprises a storage capacity of N digital words corresponding to the addresses 0 to N−1.

Initially, the write preparation shown in FIG. 6a is performed. The preparation starts at the point 107 in FIG. 5. The preparation phases is necessary in order to be located at the address of the cut-of point 104 at the start of writing the segment 102 of the line to be written. The position of the cut-off point 104 is known in advance as it is generated by, for example, a pseudo random generator controlled by a control word. The use of an identical generator on transmission and on an reception allows subscribers to carry out the unscrambling of scrambled transmissions. The preparation phase therefore consists in writing the information available between the address 0 and the address corresponding to the cut-off point 104 of the line n+1. The information written in this section of the memory is of absolutely no importance. The information available at this moment is, in the case shown in FIG. 5, the end of the segment 101 of the signal of the line n.

FIG. 6b shows the writing of the section 102 of the line n+1 in the memory. This writing starts at the point 108 of FIG. 5. The location at the end of the preparation period is the address corresponding to the point 104 of the line n+1. Now, it is precisely from this address that it is necessary, in order to carry out the unscrambling, to write the segment 102 of the line n+1 in order to invert the segments 101 and 102 during the writing in the memory. As can be seen in FIG. 6b, the end of the write phase of the period 102 of the line n+1, corresponding to the point 110 in FIG. 5, the following is obtained:

between the address 0 and the address of the cut-off point 104 of the line n+1, information relating to the end of the segment 101 of the line n;

between the address of the cut-off point 104 of the line n+1 and the address N-1, the information relating to the segment 102 of the line n+1.

As can be seen in FIG. 6c, in order to complete the unscrambling of the line n+1, it is again necessary to write, between the address 0 and the address of the cut-off point 104 of the line n+1, the information relating to the segment 101 of the line n+1. This writing is carried out between the points 110 and 111 of FIG. 5.

Thus, knowledge of the cut-off point 104 has made it possible to carry out the unscrambling by placing the segment 101 of the line n+1 before the segment 102 of the line n+1. In order to display the line n+1 it suffices to read out the memory between the address 0 and the address N−1.

In FIG. 7 there can be seen the preferred embodiment of the device for generating the read and write control signals of one of the memories. The device comprises a sampler 6. The sampler 6 receives on the one hand a line synchronization signal and on the other hand the signal from a clock 203. The output of the sampler 6 is connected to the initialization input of a counter 201. The counter 201 also receives the signals from the clock 203. The outputs of the counter 201 are connected to a decoder 202. The output of the decoder 202 supplies a write enable signal $\overline{WE1}$ or $\overline{WE2}$ and on the other hand is connected to the initialization input of the counter 211 of the image points of a line. On the other ha d the counter of the image points of a line 211 receives the signals from the clock 203. The outputs of the counter of the points of a line of the image 211 are connected to the inputs of a decoder 212. The output of the decoder 212 supplies the read enable, $\overline{RE1}$ or $\overline{RE2}$, signal 206.

The presence of a counter 201 enables, starting from a line synchronization signal 100, the carrying out of the same synchronization in all the decoders operating simultaneously at the users, premises. The decoders 202 and 212 supply a signal 205 and 206 when the counters 201 and 211 respectively reach predetermined values.

In FIG. 8 there can be seen an embodiment of a device for receiving a television transmission and comprising image unscrambling means. The device com prises a television signal source. In the example shown in FIG. 8, the device 2 is a horn associated with an antenna, for example a parabolic antenna 1, intended to receive transmissions coming from geostationary satellites. The output of the device 2 is connected to the input of a receiving device 30 of known type. The output of the receiving device 30 of known type is connected to the inputs of a synchronization separation device 4, of an analogue-digital converter 5 and of a sampling device 6. The output of the synchronization separation device 4 and of the sampling device 6 are connected to the inputs of a control device 10. The output of the analog-digital converter 5 is connected, for example by an 8-bit bus, to the inputs of a first register 7 of the first in, first out (FIFO) type, to the input of a second register 8 of the first in, first out (FIFO) type and to the input of a buffer memory 9. The control device 10 is connected by a control bus to the first register, to the second register 8 and to the buffer memory 9. The outputs of the first register 7, of the second register 8 and of the buffer memory 9 are connected the device exploiting the unscrambled images. In the example shown in FIG. 8, the outputs are connected to the input of an analog-digital converter 11. The output of the analog-digital converter 11 is connected, through a low pass filter 3, to the input of an amplifier 13. The output of the amplifier 13 is connected to the input of a cathode ray tube 14.

In the case in which scrambled transmissions are present, the access control device 32 supplies a control word (CONTROL WORD or CW in abbreviated form in English terminology) to the pseudo-random generator 31. Advantageously, the control word (CW') takes account of the number of cycles performed by the pseudo-random generator since the last initialization. The pseudo-random generator 31 supplies the position of the cut-off point 104 to the control device 10. The control device 10 controls the writing and the alternate reading of the first register 7 and of the second register 8. This writing is carried out for example according to the procedure described in FIG. 6. When non-scrambled transmissions are present, the control device 10 inhibits the writing or reading of the first stack 7 and of the second stack 8. The information passes directly through the buffer memory 9 without being rearranged. In the example shown in FIG. 8, there have for example been used stacks having a capacity of 1135 bits sold under the reference number µPD41102 or of capacity 910x 8 bits sold under the reference number µPD41101 by the NEC CORPORATION. However, the invention is not limited to the use of stacks for the storage of image lines.

In FIG. 9 there can be seen an embodiment of a device according to the present invention using a set of a first memory 17 and of a second memory 18 instead of the register 7 and 8. The memories 17 and 18 are for example dynamic random access memories (DRAM in English terminology). The addressing of the first memory 17 and of the second memory 18 is provided by an addressing circuit 15 connected by the address bus to the said memories. The address circuit 15 of known type supplies the addresses for writing into memory of digital samples supplied by the analog-digital converter 5. The addressing device 15 comprises counters for example.

In FIG. 10 there can seen the principle of use of a device according to the present invention for performing the double scanning (double scan in English terminology). The conventional television device provides a scanning of a half image every 1/50 a second. A complete image is therefore scanned in 1/25 of a second in SECAM or PAL colour television systems (1/30 of a second in NTSC systems). The scanning frequency can prove insufficient to obtain an impression of image stability. In order to improve the impression of stability of the images, each image is displayed twice successively during the normal time lapse (1/25 or 1/30 of a second) for the display of an image. In order to do this the image is stored either in line memories or in frame memories. The device according to the present invention allows an improvement of the device for storage in the line memory.

Three periods, n, n+1 and n+2 of a conventional type scanning have been shown on the line 300.

The double scanning of known type has been illustrated on the line 400.

The double scanning according to the present invention has been illustrated on the line 500.

The display of three images m, m+1 and m+2 respectively referenced 301, 303 and 305 have bee shown on the line 300.

In the scanning device of known type, such as illustrated on the line 400, the display of a first image of the line m referenced 401 is started in the middle of the display of the line m. The first display 401 of the line m is completed simultaneously with the end of the normal display 301 of the line m. During half of the display of the line m+1 303, a second display of the line m 402 is carried out. Then, in the same way, in the middle of the display of the line m+1 303 the display 403 of the line m+1 is started, and so on. In the device according to the present invention the two successive displays 501 and 502 of the line m are carried during the reception of the line m+1 303. Similarly, the displays 503 and 504 of the line m+1 are carried out during the display 305 of the line m+2, and so on. In the device according to the present invention, the same time reference is used to trigger the successive displays of the same line 501 and 502. In this way any shift in the successive display of two lines which could result from the synchronization command between two successive lines or a shift of one same line being avoided.

A device for receiving television transmissions implementing the method of FIG. 10 is shown in FIG. 11. The device of FIG. 11 comprises a video signal source symbolized by the antenna 1 and a reception device 30 of known type. T output of the reception device 30 is connected on the one hand to a line synchronization device 40 and on the other hand to an analog-digital converter 5. The output of the analog digital 5 is connected to the inputs of a first register of the first in, first-out type register 7 and of a second register of the first-in first-out type register 8. The output of the line synchronization device 40 is connected to the input of a control device 33. The outputs of the control device 33 are connected to the control inputs of the stack 7 and 8. The outputs of the registers 7 and 8 are connected to an image exploitation device. In the example shown in FIG. 11, the image exploitation device comprises a digital-analog converter 11, connected to a cathode ray tube 14 through a low pass filter 3 and an amplifier 13.

The control device 33 allows the alternate writing of one of the registers 7 or 8 while the other is in the read mode for the display of a line. During a write sequence in one of the registers 7 or 8, the other register 8 or 7 is read twice in succession. The control device 33 generates from a single time reference, for example supplied by the line synchronization device 40, the write control signal and two read control signals for each display line. The generation of these three control signals from a single time reference allows the over coming of any loss of synchronization between two successive lines resulting in particular from the transmission conditions.

It is of course understood that the use of a device carrying out more than two displays of each line does not depart from the scope of the present invention.

The device according to the present invention is applied in particular to the generation, from a common time reference, of write signals and of read signals for a memory intended for storing a video image line.

The invention applies principally to the production of devices for unscrambling scrambled television transmissions, particularly pay television transmissions.

We claim:

1. A television receiver comprising:
   an analog receiver means;
   an analog to digital converter means coupled to said analog receiver means for converting an analog signal received by said receiver circuit means into digital signals;
   control signal separation means coupled to said analog receiver means for generating synchronization and line return signals from said received analog signals;
   at least two image data memory means coupled to said analog to digital converter means for storing digital signals;
   synchronization means coupled to said control signal separation means for generating an internal synchronization signal for each line of video information in response to said line return signal;
   write address generation circuit means coupled to said image data memory means and said control signal separation means for controlling the writing into said image data memory means said digitally converted signal in an alternating line by line manner within a given frame in response to a signal from said synchronization means such that said reading and writing of a given line is controlled in response to the same signal;
   read address generation circuit means coupled to said image data memory means for generating an address from said memory from which stored signals are read from;
   digital to analog converter means coupled to said at least two image data memory means for converting digital signals read out from said memory into analog signals; and display device means coupled to said digital to analog converter means for producing a resultant display.

2. A device as in claim 1 wherein said digital memory means is implemented using DRAM.

3. A device according to claim 1 further comprising:
   a low pass filter coupled to the output of said analog to digital converter; and amplifier which provides an output scanning line for sad display device means.

4. A device as in claim 3 wherein said display device means is a CRT and wherein said device further comprises:
- a line sync generating means which provides a line sync signal to said control means such that a double scanning is performed at the output provided to said cathode ray tube.

5. A television receiver comprising:
- an analog receiver means;
- an analog to digital converter means coupled to said analog receiver means for converting an analog signal received by said receiver circuit means into digital signals;
- control signal separation means coupled to said analog receiver means for generating synchronization and line return signals from said received analog signals;
- at least two image data memory means coupled to said analog to digital converter means for storing digital signals;
- synchronization means coupled to said control signal separation means for generating an internal synchronization signal for each line of video information in response to said line return signal;
- write address generation circuit means coupled to said image data memory means for writing into said image data memory means said digitally converted signal in an alternating line by line manner within a given frame in response to a signal from said synchronization means such as that said reading and writing of a given line is controlled in response to the same signal;
- read address generation circuit means coupled to said image data memory mean and said control signal separation means for controlling and generating an address in said memory from which stored signals are read therefrom;
- digital to analog converter means coupled to said image data memory means for converting digital signals read out from said memory into analog signals; and
- display device means coupled to said digital to analog converter means for producing a resultant display.

6. A device as in claims 1 or 5 wherein said read and write address generation circuit means further comprise:
- a counter means; and
- a decoding means.

7. A device as in claim 6 further comprising:
- a unscrambling circuit having;
    - an access control circuit;
    - a pseudo-random number generating circuit coupled to
- said access control circuit; and
- a control circuit coupled to said control signal separation circuit and said pseudo-random number generating circuit to produce address control signals.

* * * * *